United States Patent
Xie et al.

(10) Patent No.: US 9,006,794 B1
(45) Date of Patent: Apr. 14, 2015

(54) LOW-VOLTAGE PROGRAMMABLE ELECTRICAL FUSES

(71) Applicant: Altera Corporation, San Jose, CA (US)

(72) Inventors: Shuang Xie, Saratoga, CA (US); Shankar Sinha, San Jose, CA (US); Cheng-Hsiung Huang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/164,018

(22) Filed: Jan. 24, 2014

(51) Int. Cl.
 *H01L 23/52* (2006.01)
 *H01L 23/525* (2006.01)
 *H01L 21/768* (2006.01)

(52) U.S. Cl.
 CPC .......... *H01L 23/5256* (2013.01); *H01L 21/768* (2013.01)

(58) Field of Classification Search
 None
 See application file for complete search history.

(56) References Cited

U.S. PATENT DOCUMENTS

| | | | |
|---|---|---|---|
| 2013/0099888 A1 | 4/2013 | Redaelli et al. | |
| 2013/0126817 A1* | 5/2013 | Joshi et al. | 257/4 |

FOREIGN PATENT DOCUMENTS

| | | |
|---|---|---|
| EP | 1673809 | 6/2006 |
| EP | 2519952 | 11/2012 |
| WO | 9303499 | 2/1993 |
| WO | 03021675 | 3/2003 |
| WO | 2005038876 | 4/2005 |
| WO | 2011081811 | 7/2011 |

* cited by examiner

*Primary Examiner* — Kyoung Lee
(74) *Attorney, Agent, or Firm* — Jason Tsai

(57) ABSTRACT

An integrated circuit with electrically programmable fuse circuitry coupled to a programming transistor is provided. The programming transistor may be a metal-oxide-semiconductor transistor that is separated from other circuitry in an integrated circuit substrate with shallow trench isolation. The electrically programmable fuse circuitry may be formed in a second layer above the integrated circuit substrate using a conductive material which may be tungsten-based. This second layer may further include interconnect wires made from the same conductive material. The electrically programmable fuse may be coupled to the programming transistor through vias and routing paths in a fourth layer above the integrated circuit substrate. The routing paths in the fourth layer may be made from a conductive material which may be different than the fuse conductive material used to form the programmable fuse circuitry.

21 Claims, 5 Drawing Sheets

LOW-VOLTAGE PROGRAMMABLE ELECTRICAL FUSES

BACKGROUND

This invention relates to integrated circuits, and more particularly, to low-voltage programmable electrical fuses used in integrated circuits.

Integrated circuits sometimes contain nonvolatile memory elements. Nonvolatile memory is used for persistent data storage and need not be reprogrammable. Rather, one-time use scenarios are acceptable. Examples of situations in which one-time programmable nonvolatile memory elements such as one-time programmable fuses and antifuses may be used include situations in which a unique identification code is loaded onto an integrated circuit or in which repair settings are permanently loaded-into an integrated circuit as part of a manufacturing process. Repair settings might, for example, permanently switch redundant circuitry into use in place of defective circuitry, thereby effectuating a permanent repair of the integrated circuit before shipping to an end user.

When forming nonvolatile memory elements for applications such as redundancy schemes and permanent data storage, it is desirable to select a memory element technology that exhibits satisfactory levels of permanency and power consumption. Traditional nonvolatile memory elements are sometimes formed using laser-programmed links or electrically programmable fuses. Laser programming of nonvolatile memory elements requires special programming tools that can add undesirable cost and complexity to the manufacturing process. Electrically programmable fuses are often preferred over laser fuses as they have a significantly lower production cost than laser fuses and may be programmed once the integrated circuit containing the fuse is already packaged. In use, a predetermined programming voltage is required to program or blow such electrical fuses. Generally, it is desirable for the predetermined programming voltage to be compatible with the voltages required by the remainder of the integrated circuit. However, as the geometries of integrated circuits decrease with each technology node, the voltages required by the remainder of the integrated circuit have lowered significantly, and integrated circuits with electrically programmable fuses may require additional power sources and circuit routing for programming or blowing the electrically programmable fuses.

It would therefore be desirable to be able to provide improved electrically programmable fuse circuitry for integrated circuits that is capable of being persistently programmed or blown at low voltages.

SUMMARY

In accordance with certain aspects of the invention, fuse circuitry in an integrated circuit may be manufactured by forming first and second layers of non-conducting material over a substrate, selectively forming trenches at a fuse location and multiple contact locations in the second layer, and selectively depositing first and second conductive materials in the trenches formed in the second layer. The first conductive material may provide routing connections for the integrated circuit in the second layer and at least one fuse with first and second fuse contacts at the fuse location, while the second conductive material provides at least one via connection at one of the multiple contact locations. The first conductive material may include tungsten, and the second conductive material may be either be silver, copper, gold, or aluminum.

If desired, a third layer that includes a first via connected to the first fuse contact and a second via connected to the second fuse contact may be formed over the second layer. In certain embodiments, a fourth layer may be formed over the third layer. The fourth layer may include first and second routing paths made from the second conductive material, and these first and second routing paths may be coupled to the first and second sets in the third layer.

In certain embodiments, the above-mentioned fuse circuitry may be manufactured by forming a programming transistor in the substrate and shallow trench isolation structures around the programming transistor to shield the programming transistor from other transistors in the integrated circuit. The programming transistor may have a gate terminal and a pair of source-drain terminals, and one of the first and second routing paths may be coupled to one of the pair of source-drain terminals.

Further features of the invention, its nature and various advantages, will be more apparent from the accompanying drawings and the following detailed description of the preferred embodiments.

DETAILED DESCRIPTION

The present invention relates to integrated circuits and more specifically to integrated circuits with electrically programmable fuses.

Integrated circuits such as programmable integrated circuits may have a need for permanently storing data. The data may be used, for example, for storing a serial number or other identification information, may be used for implementing a binning scheme in which certain features on an integrated circuit are selectively turned off, or may be used for implementing a redundancy scheme (e.g., to adjust the settings of bypass switches that switch redundant circuitry into place to repair circuitry that has been identified as defective during testing).

In applications such as these, it may be necessary to permanently load data onto a given integrated circuit, so that the loaded data (e.g., redundancy settings, etc.) will be retained, even in the event that the integrated circuit is not powered. Permanent (nonvolatile) configuration, which is a requirement in these applications, may be achieved by altering the physical structures of nonvolatile elements during programming operations.

For example, nonvolatile elements may be formed using electrically programmable fuses. Electrically programmable fuses require a predetermined programming voltage to program or blow such electrical fuses. Generally, it is desirable for the predetermined programming voltage to be compatible with the voltages required by the remainder of the integrated circuit. However, as the geometries of integrated circuits decrease with each technology node, the voltages required by the remainder of the integrated circuit have lowered significantly, and blowing conventional electrically programmable fuses (e.g., copper fuses) at these lower voltages may not yield persistent results. Thus, integrated circuits with electrically programmable fuses may require additional power sources and circuit routing for programming or blowing the electrically programmable fuses.

In some applications, a reduced programming voltage may be required (e.g., to avoid damage to circuitry that is coupled to electrically programmable fuses). For example, high-speed serial transceiver circuitry may require a programming voltage of 1.5V. However, a conventional copper fuse that is blown with a programming voltage of 1.5V may not provide persistent programming and recover (i.e., revert the programming) after certain cumulative time of performing a read operation.

It may therefore be desirable to provide improved electrically programmable fuse circuitry for integrated circuits that is capable of being persistently programmed or blown at low voltages.

It will be recognized by one skilled in the art, that the present exemplary embodiments may be practiced without some or all of these specific details. In other instances, well-known operations have not been described in detail in order not to unnecessarily obscure the present embodiments.

Figure 1:
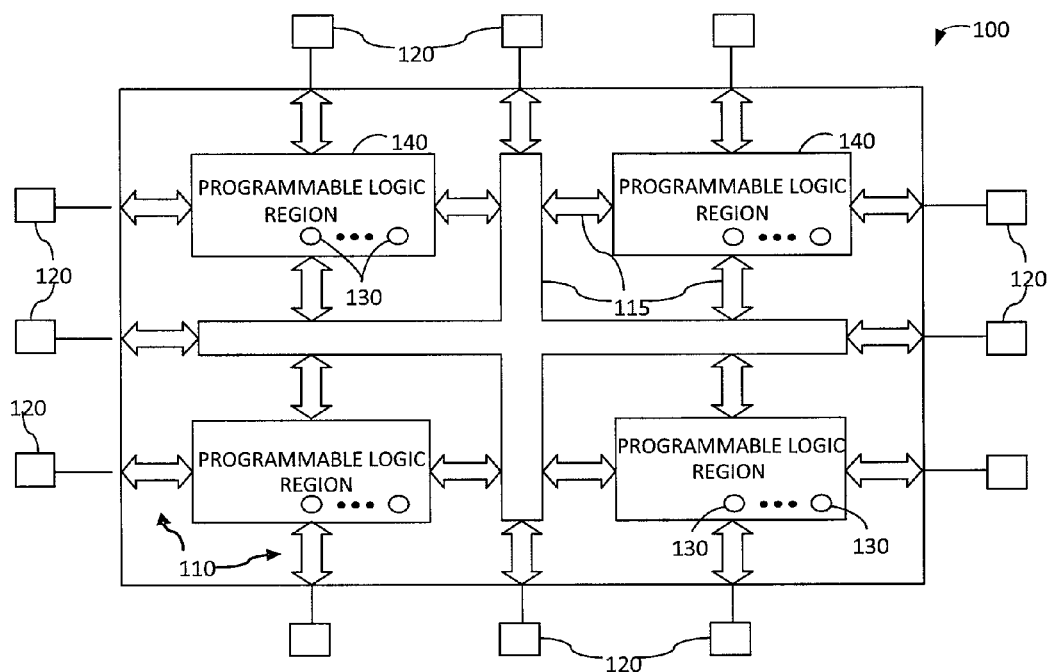
FIG. 1 is an illustrative diagram of a programmable integrated circuit with programmable logic regions in accordance with an embodiment.

An illustrative embodiment of an integrated circuit such as a programmable logic device 100 in accordance with the present invention is shown in FIG. 1. Programmable logic device 100 has input/output circuitry 110 for driving signals off of device 100 and for receiving signals from other devices via input/output pins 120. Interconnection resources 115 such as global and local vertical and horizontal conductive lines and buses may be used to route signals on device 100.

Input/output circuitry 110 include conventional input/output circuitry, serial data transceiver circuitry, differential receiver and transmitter circuitry, or other circuitry used to connect one integrated circuit to another integrated circuit.

Interconnection resources 115 include conductive lines and programmable connections between respective conductive lines and are therefore sometimes referred to as programmable interconnects 115.

Programmable logic region 140 may include programmable components such as digital signal processing circuitry, storage circuitry, arithmetic circuitry, or other combinational and sequential logic circuitry. The programmable logic region 140 may be configured to perform a custom logic function. The programmable logic region 140 may also include specialized blocks that perform a given application and have limited configurability. For example, the programmable logic region 140 may include specialized blocks such as configurable storage blocks, configurable processing blocks, programmable phase-locked loop circuitry, programmable delay-locked loop circuitry, or other specialized blocks with limited configurability. The programmable interconnects 115 may also be considered to be a type of programmable logic region 140.

The circuitry of device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blocks (LABs) containing multiple logic elements or multiple ALMs.

Programmable logic device 100 contains programmable memory elements 130. Memory elements 130 can be loaded with configuration data (also called programming data) using pins 120 and input/output circuitry 110. Once loaded, the memory elements each provide a corresponding static control signal that controls the operation of an associated logic component in programmable logic region 140. In a typical scenario, the outputs of the loaded memory elements 130 are applied to the gates of metal-oxide-semiconductor transistors in programmable logic region 140 to turn certain transistors on or off and thereby configure the logic in programmable logic region 140 and routing paths. Programmable logic circuit elements that may be controlled in this way include parts of multiplexers (e.g., multiplexers used for forming routing paths in programmable interconnects 115), look-up tables, logic arrays, AND, OR, NAND, and NOR logic gates, pass gates, etc.

Memory elements 130 may use any suitable volatile and/or non-volatile memory structures such as random-access-memory (RAM) cells, fuses, antifuses, programmable read-only-memory memory cells, mask-programmed, electrically programmed, and laser-programmed structures, combinations of these structures, etc. Because memory elements 130 are loaded with configuration data during programming, memory elements 130 are sometimes referred to as configuration memory, configuration RAM, or programmable memory elements.

During device programming, configuration data is loaded into device 100 that configures the programmable logic regions 140 so that their logic resources perform desired logic functions. Electrically programmable fuses may be programmed by applying a programming current in excess of a fuse's maximum current-handling capacity. The current that flows through the fuse contacts and the fuse link between the fuse contacts may heat the fuse link. When heated sufficiently, some of the fuse link may be removed to form a void or a crack. Some of the material of the fuse link may also diffuse towards the fuse contacts when the fuse link is heated.

Figure 2:
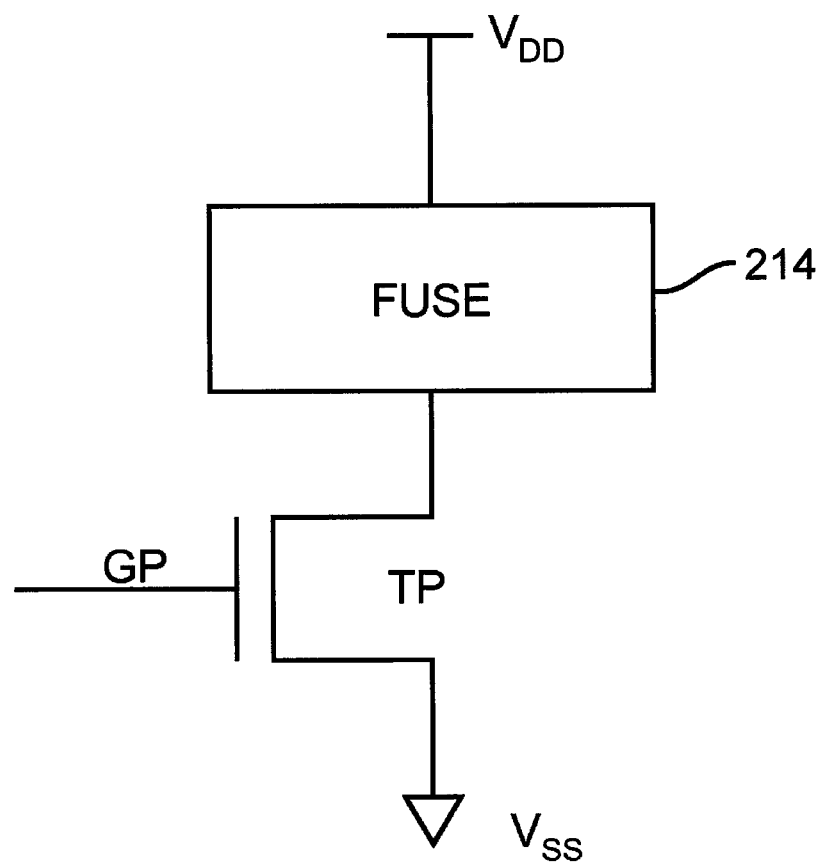
FIG. 2 is a diagram of an illustrative fuse circuit with a programming transistor in accordance with an embodiment.

Any suitable programming circuitry may be used to control the application of programming signals to electrically programmable fuses. For example, an electrically programmable fuse may be programmed using a programming transistor such as transistor TP of FIG. 2. As shown, programming transistor TP is an n-channel metal-oxide-semiconductor (NMOS) transistor. If desired, other electrically controllable switch circuitry (e.g., a p-channel metal-oxide-semiconductor (PMOS) transistor) may be used to control the application of programming signals to electrically programmable fuses.

When it is desired to program the fuse that is connected to NMOS transistor TP, the gate GP of that transistor may be taken high by application of an associated control signal (e.g., a pulse). When gate GP of NMOS transistor TP is taken high, a programming current will flow from positive power supply terminal VDD (e.g., a supply at 1.5 volts) to ground node VSS (e.g., a ground power supply terminal at 0 volts) through fuse 214 and programming transistor TP. This current may program fuse 214. This program methodology and circuitry can be extended to circuits powered by negative power supplies.

Having a low power supply voltage may reduce the probability of time-dependent dielectric-breakdown (TDDB) of the unselected programming transistors, which is the expected time required for a low electric field to create a conducting path through the gate oxide of a programming transistor, and thus cause the destruction of the unselected programming transistor. The time is dependent on the total oxide area of all programming transistors, the temperature, and the programming voltage. For example, NMOS programming transistors with a total oxide area of one million square microns have a time-dependent dielectric breakdown (TDDB) of less than one second at 100 degrees C. and a supply voltage of 1.8 volts. A reduction from 1.8 volts to 1.5 volts may improve TDDB by a factor of 1000, for example, (i.e., TDDB increases to over 1000 seconds) which may provide sufficient time to configure all electrically programmable fuses in an integrated circuit.

Figure 3:
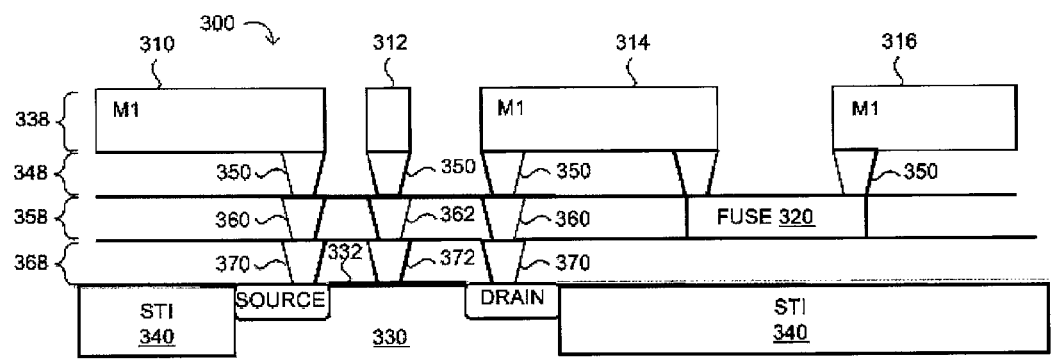
FIG. 3 is a diagram of an illustrative cross-section of a substrate with a programming transistor and multiple layers with vias, a fuse, and interconnect structures on top of the substrate in accordance with an embodiment.

FIG. 3 shows a diagram of an illustrative cross-section 300 of an electrically programmable fuse 320 coupled to a programming transistor 330 in an integrated circuit substrate. As shown, the integrated circuit substrate may include programming transistor 330 with a pair of source-drain terminals and a gate terminal 372. Shallow trench isolation (STI) 340 may separate programming transistor 330 from surrounding circuitry. Multiple layers (e.g., 348, 358, and 368) may separate the integrated circuit substrate from layer 338 which may include wires (Ml).

Layers 348, 358, and 368 may primarily be formed from non-conducting material such as dielectric material. Via connections in layers 348, 358, and 368 such as vias 350, 360, 362, and 370 may couple the gate terminal 372 as well as the source and drain terminals of programming transistor 330 to layer 338. As shown, layer 358 may include additional circuitry. For example, layer 358 may include fuse 320 and interconnect circuitry such as routing paths (not shown). Fuse 320 may have a programmable fuse link and at least two fuse terminals.

A first fuse terminal of fuse 320 may be coupled to wire 314 in layer 338 by at least one via 350 in layer 348, and a second fuse terminal of fuse 320 may be coupled to wire 316 in layer 338 by at least one via 350 in layer 348. Having more than one via 350 coupling each of the fuse terminals to layer 338 may reduce the resistance of the path from wire 314 to wire 316 and thereby reduce the voltage that is required to blow the fuse link.

Fuse 320, the interconnect circuitry in layer 358, and at least some of the via connections (e.g., vias 360 and 370) may be formed from a first conducting material. Vias 350 and 362 and the wires in layer 338 may be formed from a second conducting material that is different than the first conducting material. For example, the second conducting material may include silver, copper, gold, or aluminum, whereas the first conducting material may be based on tungsten.

Electrically programmable fuse circuitry made from conducting material based on tungsten stack may have several advantages over electrically programmable fuse circuitry made from other conducting material such as copper alloys. For example, a fuse made from conducting material based on tungsten stack may require a lower programming voltage and may blow a fuse link persistently compared to a fuse made from a conducting material that is based on copper. For example, a copper fuse may recover from a blown state after two seconds of continuous read, while a fuse made from conducting material based on tungsten stack may not recover even after a much longer period of continuous read.

Wire 316 in layer 338 may be coupled to a positive power supply terminal (e.g., VDD) and wire 310 to a ground power supply terminal (e.g., VSS). During configuration of fuse 320, wire 312 may convey a control signal such as a pulse signal through vias 350 and 362 to gate terminal 372 of programming transistor 330. The control signal may take the gate high. As a result, a channel may form under gate oxide 332 between drain and source of programming transistor 330. Thus, a programming current may flow from the positive power supply terminal over wire 316, via 350, through fuse 320, and via 350 to wire 314. From there, the programming current may flow through vias 350, 360, and 370 to the channel under the gate oxide 332 to the source terminal, and through vias 370, 360, and 350, and wire 310 to the ground power supply terminal.

The programming current may cease to flow when the control signal takes the gate low again or when the programming current blows fuse 320, whatever happens first. The programming current may blow fuse 320 by creating a void or crack in the programmable fuse link between the fuse terminals, thereby decoupling wire 314 from wire 316.

The resistance of the path that the programming current takes between positive power supply and ground power supply may vary only little once the control signal has taken the gate high. Thus, blowing a fuse may depend on the programming voltage, the programming current, and the duration that the programming current flows through the fuse as well as the physical characteristics of the fuse (e.g., material, diameter, and length of the programmable fuse link). Satisfactory configuration of an electrically programmable fuse may also involve the use of a programming transistor 330 that is sufficiently large to handle expected levels of programming current.

Figure 4:
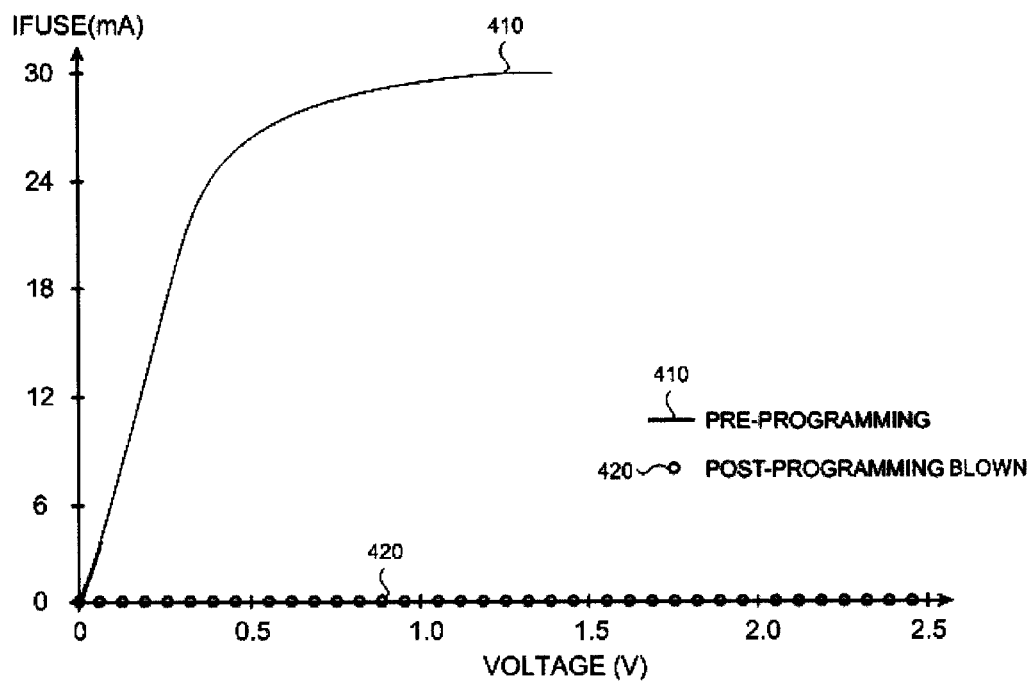
FIG. 4 is a diagram of an illustrative current profile through an electrically programmable fuse circuit before and after programming in accordance with an embodiment.

FIG. 4 is a diagram of an illustrative current profile through an electrically programmable fuse circuit such as fuse 320 of FIG. 3 before and after programming for a given voltage in accordance with an embodiment. Configuration of an electrically programmable fuse may involve blowing the fuse or leaving the fuse intact. Configuring a fuse such that the fuse remains intact may require the programming transistor to be shutoff (i.e., the gate terminal 372 of programming transistor 330 of FIG. 3 remains low) to prevent a programming current from flowing through the fuse. In such a configuration, the fuse may serve as a routing wire.

Configuring a fuse by blowing the fuse link may require the programming transistor to turn on the flow of a programming current 410 through the fuse. Unless the programming current reaches a given limit (e.g., 30 mA) for a given duration, the fuse may remain intact. Once the current reaches a predetermined blow limit for a predetermined period of time, the fuse may blow and reach a post-programming state in which the fuse is blown. Post-programming 420, the current that flows through the fuse ideally remains zero.

The current profile shown in FIG. 4 is merely illustrative and may depend on multiple factors such as the length of the fuse link. For example, consider a programming voltage of 1.5V and a control signal in form of a 0.01 ms wide pulse. In this example, a fuse link made of 62 nm tungsten between two fuse contacts may require a programming current of 30 mA to blow, whereas a fuse link made of 124 nm tungsten may already blow when the programming current reaches 20 mA.

Figure 5:
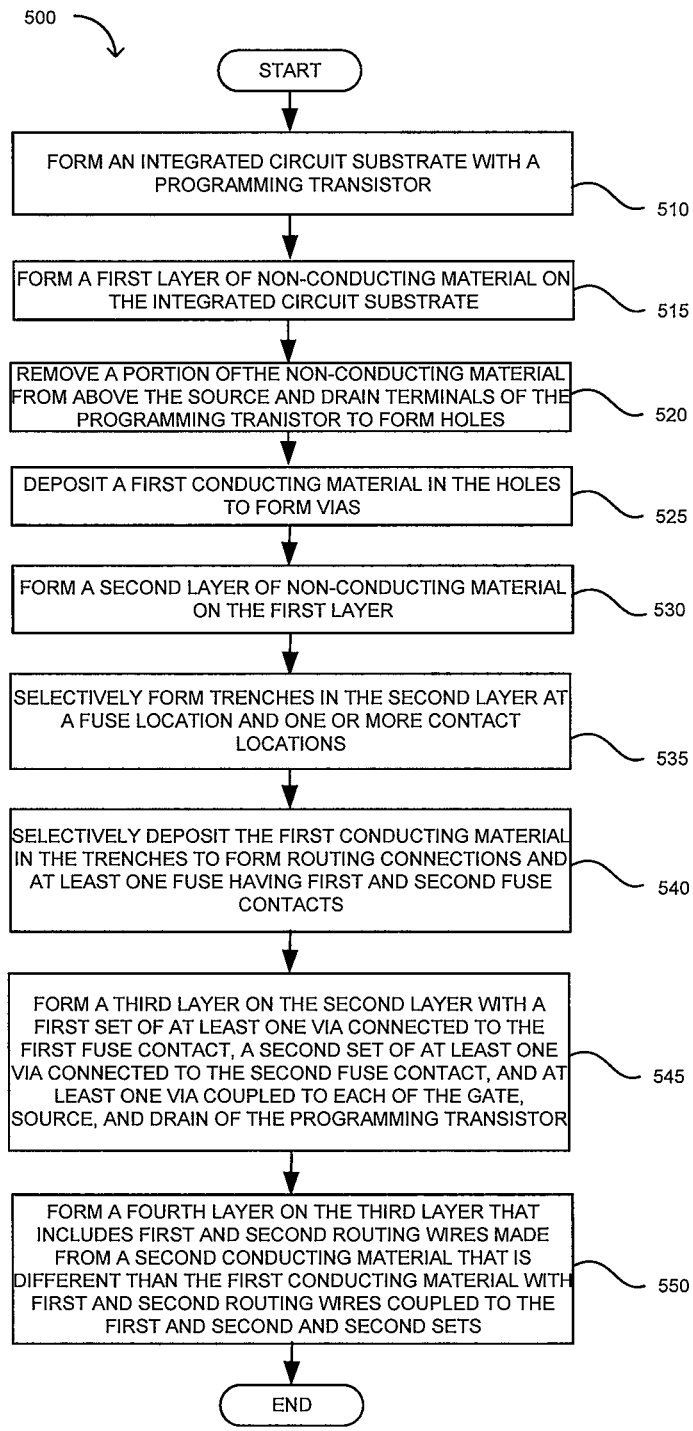
FIG. 5 is a flow chart showing illustrative steps for manufacturing an electrically programmable fuse circuit coupled to a programming transistor in a substrate in accordance with an embodiment.

FIG. 5 shows a flow chart of illustrative steps that foundry equipment may perform for manufacturing an electrically programmable fuse (e.g., electrically programmable fuse 320 of FIG. 3) coupled to a programming transistor (e.g., programming transistor 330 in FIG. 3) in an integrated circuit substrate.

During step 510, the foundry equipment may form a programming transistor in an integrated circuit substrate. For example, the foundry equipment may form an NMOS transistor with sufficient width to carry a programming current. The foundry equipment may separate the programming transistor from surrounding circuitry by depositing shallow trench isolation around the programming transistor.

During step 515, a first layer of non-conducting material may be formed on the integrated circuit substrate. For example, a layer of dielectric material may be deposited on top of the integrated circuit substrate to form the first layer.

Subsequently, during step 520, a portion of the non-conducting material may be removed from above the source and drain terminals of the programming transistor to form holes. As an example, the removal process may include the steps of applying photoresist, aligning a mask that exposes the non-conducting material above the source and drain terminals, exposing the exposed non-conducting material with light, developing and removing the photoresist that was exposed to the light, etching the exposed non-conducting material, and removing the remaining photoresist.

During step 525, a deposited first conductive material (e.g., a tungsten-based material) may form vias in the holes. During step 530, a second layer of non-conducting material (e.g., a layer of dielectric material) may be formed on the first layer.

During step 535, another removal process may selectively form trenches in the second layer at a fuse location and one or more contact locations. As an example, the other removal process may include the steps of applying photoresist, aligning a mask that exposes the non-conducting material at the selected locations, exposing the exposed non-conducting material with light, developing and removing the photoresist that was exposed to the light, etching the exposed non-conducting material, and removing the remaining photoresist.

During step 540, the deposited first conducting material (e.g., a tungsten-based material) may form routing connections in the trenches and at least one fuse having first and second fuse contacts.

During step 545, a third layer may be formed on top of the second layer with a first via connected to the first fuse contact, a second via connected to the second fuse contact, and at least one via coupled to each of the gate, source, and drain of the programming transistor. A second conducting material that is different than the first conducting material may form the vias in the third layer. For example, the second conducting material may include a material based on silver, aluminum, gold, or copper or any alloy containing any of these materials.

During step 550, a fourth layer may be formed on the third layer. The fourth layer may include first and second routing paths made from the second conductive material which is different than the first conductive material. The first and second routing paths may connect to the first and second vias.

The method and apparatus described herein may be incorporated into any suitable electronic device or system of electronic devices. For example, the method and apparatus may be incorporated into numerous types of devices such as microprocessors or other integrated circuits (ICs). Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using high-speed serial interface circuitry is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. Fuse circuitry, comprising:
   a substrate;
   a first via layer formed on the substrate;
   a routing layer formed over the first via layer;
   first and second conductive structures formed in the routing layer, wherein the first conductive structures are formed from a first type of conductive material, and wherein the second conductive structures are formed from a second type of conductive material that is different than the first type of conductive material; and
   a programmable fuse link having first and second terminals formed in the routing layer, wherein the programmable fuse link is coupled to at least one of the first and second conductive structures, and wherein the programmable fuse link is formed from the first type of conductive material.

2. The fuse circuitry of claim 1, further comprising:
   a second via layer formed over the routing layer, wherein the second via layer includes a first conductive via structure that is coupled to the first terminal of the programmable fuse link and a second conductive via structure that is coupled to the second terminal of the programmable fuse link.

3. The fuse circuitry of claim 1, wherein the first type of conductive material comprises tungsten.

4. The fuse circuitry of claim 1, wherein the second type of conductive material is selected from the group consisting of silver, copper, gold, and aluminum.

5. The fuse circuitry of claim 1, further comprising:
   a programming transistor that is formed in the substrate and that includes a source-drain terminal that is coupled to the first terminal of the programmable fuse link through the first conductive structures.

6. The fuse circuitry of claim 5, further comprising:
   shallow trench isolation structures in the substrate around the programming transistor.

7. The fuse circuitry of claim 5 further comprising:
   a first power supply line on which a first power supply voltage is provided; and
   a second power supply line on which a second power supply voltage that is different than the first power supply voltage is provided, wherein the second terminal of the programmable fuse link is coupled to the first power supply line, and wherein the programming transistor has an additional source-drain terminal that is coupled to the second power supply line.

8. The fuse circuitry of claim 7, wherein the programming transistor also includes a gate terminal that receives a programming signal, wherein a current flows through the programming transistor and the programmable fuse link when the programming signal is asserted, and wherein the programming current programs the programmable fuse link in a desired state.

9. A method for manufacturing fuse circuitry on an integrated circuit, comprising:
   forming a first layer of non-conducting material over a substrate;
   forming a second layer of non-conducting material over the first layer;
   forming trenches at first and second locations in the second layer;
   depositing first conductive material into the trenches at the first location in the second layer to form a fuse circuit; and
   depositing second conductive material into the trenches at the second location in the second layer to form a routing path, wherein the second conductive material is different than the first conductive material.

10. The method of claim 9, wherein the first conductive material comprises tungsten.

11. The method of claim 9, further comprising:
   forming a third layer over the second layer, wherein the third layer includes a first via connected to a first terminal of the fuse circuit and a second via connected to a second terminal of the fuse circuit; and
   forming a fourth layer over the third layer, wherein the fourth layer includes first and second routing paths formed from the second conductive material, and wherein the first and second routing paths are coupled to the first and second vias in the third layer.

12. The method of claim 11, further comprising:
   forming a programming transistor in the substrate, wherein the programming transistor has a gate terminal and a pair of source-drain terminals, wherein one of the source-drain terminals of the programming transistor is coupled to one of the first and second routing paths.

13. The method of claim 12, wherein forming the first layer comprises:
   removing the non-conducting material from at least a portion of the first layer above the pair of source-drain terminals to form first and second contact holes; and
   depositing the first conductive material in the first and second contact holes to form third and fourth vias that connect to the pair of source-drain terminals.

14. The method of claim 13, wherein forming the second layer further comprises:
   depositing the first conductive material on top of the third and fourth vias to extend the third and fourth vias across the second layer.

15. The method of claim 14, wherein forming the third layer further comprises:
   depositing the second conductive material on top of the extended third and fourth vias to connect one of the extended third and fourth vias to one of the first and second routing paths in the fourth layer.

16. The method of claim 12, further comprising:
   depositing the second conductive material in one of the trenches formed in the second layer on top of the gate terminal to form a fifth via that connects to the gate terminal; and
   depositing the second conductive material on top of the fifth via in the third layer to connect the fifth via to a third routing wire made from the second conductive material in the fourth layer.

17. An integrated circuit, comprising:
   a transistor with a gate structure and first and second source-drain terminals;
   first and second dielectric layers formed over the gate structure of the transistor;
   a first routing structure that is formed from a first conductive material in the first dielectric layer and that is coupled to one of the first and second source-drain terminals of the transistor; and
   a second routing structure that is formed from a second conductive material in the second dielectric layer and that is coupled to the gate structure of the transistor, wherein the first conductive material is different than the second conductive material.

18. The integrated circuit of claim 17, wherein the first conductive material comprises tungsten.

19. The integrated circuit of claim 17, further comprising:
   a programmable fuse circuit that is formed from the first conductive material, that is formed in the first dielectric layer, and that is coupled to one of the first and second source-drain terminals of the transistor.

20. The integrated circuit of claim 19, further comprising:
   a first power supply line on which a first power supply voltage is provided; and
   a second power supply line on which a second power supply voltage that is different than the first power supply voltage is provided, wherein the programmable fuse circuit and the transistor are coupled in series between the first power supply line and the second power supply line.

21. The integrated circuit of claim 20, wherein the gate terminal receives a programming signal, wherein a current flows through the transistor and the programmable fuse circuit when the programming signal is asserted, and wherein the current programs the programmable fuse circuit in a desired state.

\* \* \* \* \*